US008713791B1

(12) United States Patent
Walker et al.

(10) Patent No.: US 8,713,791 B1
(45) Date of Patent: May 6, 2014

(54) SOLDERING FIXTURE

(75) Inventors: Kurt Walker, Los Osos, CA (US); Paul J. Schmidt, Santa Barbara, CA (US)

(73) Assignee: Rantec Power Systems, Inc., Los Osos, CA (US)

( * ) Notice: Subject to any disclaimer, the term of this patent is extended or adjusted under 35 U.S.C. 154(b) by 21 days.

(21) Appl. No.: 13/482,802

(22) Filed: May 29, 2012

Related U.S. Application Data

(63) Continuation of application No. 12/344,088, filed on Dec. 24, 2008, now Pat. No. 8,186,041.

(51) Int. Cl.
*H05K 3/34* (2006.01)

(52) U.S. Cl.
USPC .................. 29/840; 29/747; 29/832; 29/834; 219/85.18; 228/44.7; 228/180.1

(58) Field of Classification Search
USPC ................ 29/747, 832, 834, 840; 219/85.18, 219/85.19; 228/44.7, 45, 49.5, 180.1, 228/180.21, 180.22
See application file for complete search history.

(56) References Cited

U.S. PATENT DOCUMENTS 4,693,408 A * 9/1987 Dines et al. .................. 228/49.5

* cited by examiner

*Primary Examiner* — Peter DungBa Vo
*Assistant Examiner* — Jeffrey T Carley
(74) *Attorney, Agent, or Firm* — Hickman Palermo Truong Becker Bingham Wong LLP

(57) ABSTRACT

A soldering fixture is disclosed having a unitary base member configured to maintain a printed circuit board and an electrical connector in a particular orientation during soldering. The unitary base member includes a lateral channel dimensioned to maintain a plurality of wire leads associated with the electrical connector in a spaced relationship with the printed circuit board. The unitary base member further includes a wire alignment tool configured to align the plurality of wire leads in the particular orientation such that the plurality of wire leads are in juxtaposition with a plurality of solder pads affixed to one or more surfaces of the printed circuit board.

12 Claims, 5 Drawing Sheets

SOLDERING FIXTURE

CROSS-REFERENCE TO RELATED APPLICATIONS

Benefit Claim

This application claims the benefit as a Continuation of application Ser. No. 12/344,088, filed Dec. 24, 2008 now U.S. Pat. No. 8,186,041, the entire contents of which is hereby incorporated by reference as if fully set forth herein, under 35 U.S.C. §120. The applicants hereby rescind any disclaimer of claim scope in the parent application or the prosecution history thereof and advise the USPTO that the claims in this application may be broader than any claim in the parent application.

TECHNICAL FIELD

The present disclosure relates generally to soldering fixtures for attaching connectors to printed circuit boards.

BACKGROUND

Electronic components may be attached to printed circuit boards by a variety of techniques. Traditional techniques include soldering of wire leads extending through holes in the printed circuit board onto a metal foil. As electronic components have become smaller and more integrated, traditional soldering techniques have largely been replaced by wave soldering. Wave soldering allows for large-scale soldering of the electronic components to the printed circuit board (PCB) in a single process which greatly reduces the cost of assembly and improves the quality of the solder connections. However, wave soldering techniques are limited to one side of a given printed circuit board per solder application. To minimize the number of soldering applications, and hence achieve further reductions in assembly costs, reflow soldering techniques are supplanting wave soldering techniques.

Reflow soldering techniques are used with surface mount technology (SMT) electronic components. The surface mounted electronic components are attached to specially prepared printed circuit boards with adhesive and existing solder pads. The entire circuit board is heated to the melting point of the solder present on the existing solder pads which then reflows and bonds with the wire leads extending from the electronic components on both sides of a printed circuit board, in a single soldering operation.

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

BRIEF DESCRIPTION OF THE DRAWINGS

The features and advantages of the various example embodiments contained in this disclosure will become apparent from the following detailed description when considered in conjunction with the accompanying drawings. Where possible, the same reference numerals and characters are used to denote like features, elements, components or portions of the various inventive embodiments. Optional components, features or embodiments are generally shown in dotted lines. It is intended that changes and modifications can be made to the described example embodiments without departing from the true scope and spirit of the various inventive embodiments as is generally defined by the Claims.

In the drawings.

DETAILED DESCRIPTION

Figure 1:
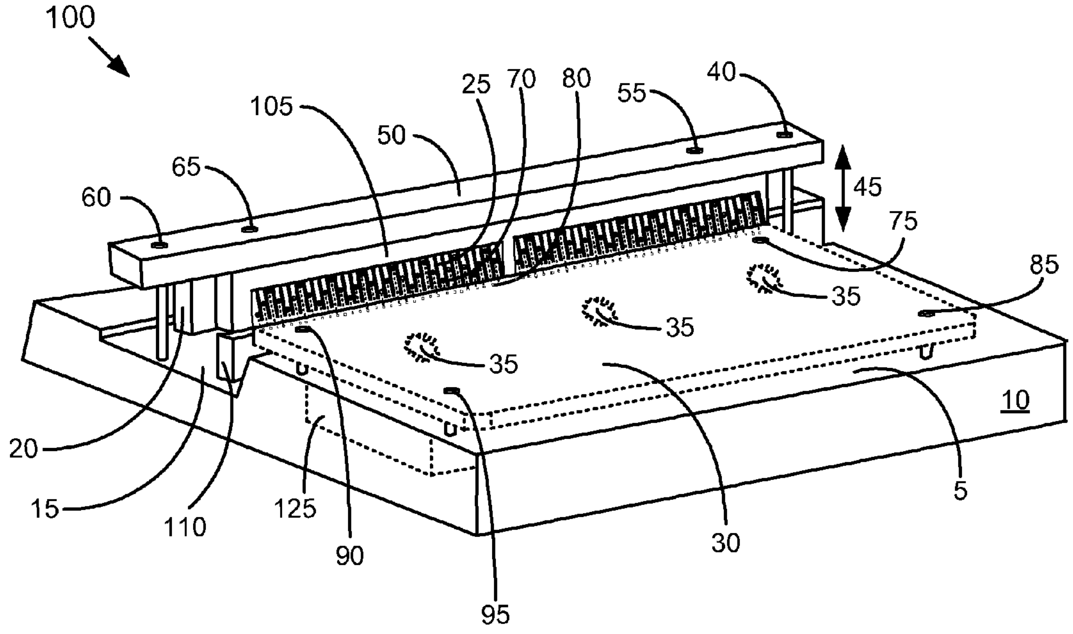
FIG. 1 is an isometric view of a soldering fixture in accordance with an embodiment.

In the following description, for the purposes of explanation, numerous specific details are set forth in order to provide a thorough understanding of the various inventive embodiments. It will be apparent, however, to one skilled in the art that the present invention may be practiced without these specific details. In other instances, well-known structures and devices are shown in block diagram form in order to avoid unnecessarily obscuring the present inventive embodiments.

Embodiments are described herein according to the following outline:

| | |
|---|---|
| 1.0 | General Overview |
| 2.0 | Structural and Functional Overview |
| 3.0 | Soldering Fixture |
| 3.1 | Soldering Fixture Structural Details |
| 3.2 | Soldering Fixture Functional Details |
| 4.0 | Extensions and Alternatives |

1.0 General Overview

In an embodiment, a soldering fixture which allows reflow soldering of an electrical connector to a printed circuit board is disclosed. The ability to solder the electrical connector to the printed circuit board simplifies construction, lowers assembly cost and improves the reliability of an electronic assembly by eliminating the need for manual soldering of electrical connectors having a large number of wire leads. Embodiments may be used, for example, in many avionics, military and space electronics packages.

In an embodiment, the soldering fixture includes a unitary base member which is configured to maintain a printed circuit board and an electrical connector in a particular orientation during soldering. The unitary base member includes a lateral channel dimensioned to maintain a plurality of wire leads associated with the electrical connector in a spaced relationship with the printed circuit board. The unitary base member further includes a wire alignment tool configured to align the plurality of wire leads in the particular orientation such that the plurality of wire leads are in juxtaposition with a plurality of solder pads affixed to one or more surfaces of the printed circuit board.

In an embodiment, the wire alignment tool includes a wire retainer comb. The wire retainer comb includes a plurality of uniformly spaced prongs configured to laterally align the plurality of wire leads with the plurality of solder pads affixed to the one or more surfaces of the printed circuit board. In an embodiment, the wire retainer comb further includes a plurality of uniformly spaced void spaces configured to axially align the plurality of wire leads with the plurality of solder pads affixed to the one or more surfaces of the printed circuit board.

In an embodiment, the wire alignment tool includes an inverted U-shaped support which spans a lateral dimension of at least the electrical connector that is installed.

In an embodiment, the wire retainer comb is slidably coupled to the inverted U-shaped support and perpendicularly aligned with the unitary base member.

In an embodiment, the soldering comprises reflow solid solder deposit.

In an embodiment, the unitary base member further includes at least one retention member for maintaining the printed circuit board in the particular orientation during soldering.

In an embodiment, the retention member may include a strap, a pin, a clip, a clamp, and/or a fastener.

In an embodiment, the unitary base member is constructed from a material having a higher melting temperature than a temperature used in the soldering.

In an embodiment, the wire alignment tool comprises at least two wire retainer combs aligned in opposition on opposing surfaces of the printed circuit board.

In other example embodiments, a process for using a soldering fixture is provided.

2.0 Structural and Functional Overview

In various example embodiments, a unitary base member dimensioned to receive and maintain a printed circuit board for reflow soldering of an electrical connector is disclosed.

The unitary base member serves as a support structure for the printed circuit board and a wire alignment tool coupled to a predominate face of the base member.

The electrical connector may be a singular or split into multiple segments. A lateral channel is provided in the unitary base which is dimensioned to receive the electrical connector and associated wire leads which extend from the electrical connector. In an embodiment, the lateral channel is configured to only allow placement of the electrical connector in the soldering fixture in a proper orientation for soldering of the wire leads to the printed circuit board.

A wire alignment tool is coupled to the unitary base and includes a support structure for maintaining one or more wire retainer combs. The wire alignment tool is configured to allow longitudinal placement of the one or more wire retainer combs between the electrical connector and in proximity to an edge of the printed circuit board in which the wire leads are to be soldered.

In an embodiment, the one or more wire retainer combs are disposed within the lateral channel which allows the one or more wire retainer combs to align the wire leads in juxtaposition with the solder pads affixed to the printed circuit board. In one embodiment, the one or more wire retainer combs laterally align the wire leads extending from the electrical connector with the solder pads affixed to the printed circuit board.

In another embodiment, the one or more wire retainer combs axially align the wire leads extending from the electrical connector with the solder pads affixed to the printed circuit board. In yet another embodiment, the one or more wire retainer combs axially and laterally align the wire leads extending from the electrical connector with the solder pads affixed to the printed circuit board. In an embodiment, the one or more wire retainer combs are aligned perpendicularly to the predominate face of the unitary base member.

In an embodiment, the printed circuit board is maintained in a particular orientation using guide pins, retaining clips, fasteners and/or a clamp. In an embodiment, the particular orientation of the printed circuit board is generally parallel to the predominate face of the unitary base member.

In an embodiment, the soldering fixture does not require any moving parts, except for the placement and removal of the one or more wire retainer combs.

In an embodiment, once the electrical connector, wire alignment tool including the one or more wire retainer combs and the printed circuit board have been installed on the soldering fixture, the entire assembly may then be placed in an oven to allow melting and reflow of solder affixed to the solder pads to bond with the wire leads. In this embodiment, some or all of the electronic components installed by surface mount adhesion may be bonded to the printed circuit board in a single reflow soldering operation.

In another embodiment, only the area of the printed circuit board in proximity to the solder pads is heated to the melting point of the solder affixed to the solder pads. In this embodiment, the electrical connector is the only component added to the printed circuit board.

3.0 Example Soldering Fixture 3.1 Example Soldering Fixture Structural Details

FIG. 1 is an isometric view of a soldering fixture in accordance with an example embodiment. A soldering fixture 100 comprises a unitary base member 10 having a lateral channel 15 dimensioned to receive and maintain an electrical connector 20. A printed circuit board 30 in which the electrical connector 20 is to be soldered is supported on a predominate face 5 of the unitary base member 10. The printed circuit board 30 may include one or more electronic components 35 mounted on top and/or bottom surfaces of the printed circuit board 30. In an embodiment, a cutout 125 is provided in the unitary base member 10 to allow for sufficient clearance of electronic components 35 mounted on an underside of the printed circuit board 30.

In an embodiment, the printed circuit board 30 is maintained in a particular orientation on the predominate face 5 of the unitary base member 10 for soldering of the electrical connector 20 to the printed circuit board 30. The printed circuit board 30 may be maintained in the particular orientation by the use of guide pins 75, 85, 90, 95 which axially extend from the predominate face 5 of the unitary base member 10. Alternate arrangements for maintaining the printed circuit board in the particular orientation are described below.

The particular orientation generally aligns an edge of the printed circuit board 30 containing solder pads 80 in which the electrical connector 20 is to be soldered using reflow solid solder deposit in a parallel spaced relationship with the electrical connector 20. A wire alignment tool 45 is coupled to the unitary base member 10 at a position which disposes the wire alignment tool 45 between the electrical connector 20 and the printed circuit board 30. Example electrical connectors suitable for use with the soldering fixture 100 include Amphenol line replaceable modules (LRM).

In an embodiment, the wire alignment tool 45 is perpendicularly coupled to the unitary base member 10 at about a forward edge of the lateral channel 15 and aligned in parallel with a long dimension of the lateral channel 15. The wire alignment tool 45 is comprised of a removable elongated member 50 dimensioned to approximately span a long dimension of the lateral channel 15. A pair of axially aligned support columns 40, 60 which are perpendicularly coupled to the unitary base member 10 at about edges of the long dimension of the lateral channel 15.

In an embodiment, the elongated member 50 is slidably coupled to the pair of axially support columns 40, 60 using a lateral slide-lock arrangement. The lateral slide-lock arrangement uses decreasing diameter apertures (not shown) provided in the elongated member 50 to capture or lock into position, counterpart decreasing diameter sections of the pair of support columns 40, 60 which protrude through the apertures. Installation or removal of the elongated member 50 is performed by laterally sliding the elongated member 50 until the tapered apertures engage or disengage from the counterpart decreasing diameter sections of the pair of support columns 40, 60. One having ordinary skill in the art will appreciate that many other arrangements may used to couple the elongated member 50 with the pair of support columns 40, 60.

In an embodiment, the elongated member 50 and the pair of support columns 40, 60 form an inverted U-shaped support structure which maintains one or more wire retention combs 105, 110 between the electrical connector 20 and the printed circuit board 30. The wire retention combs 105, 110 are configured to laterally and/or axially position wire leads 70 (seen in FIG. 2) extending from the electrical connector in close juxtaposition and/or in contact with the solder pads 80 to which the electrical connector 20 is to be soldered. In an embodiment, soldering is performed using reflow solid solder deposit or other techniques known in the art. In an embodiment, the electronic components 35 are affixed to the printed circuit board 30 using surface mount technology.

In another embodiment, the printed circuit board is prepared by SIPAD Systems, Incorporated; 360-C Winkler Drive, Alpharetta, Ga. 30004, as described in documents at the internet domain "sipad.com" of the World Wide Web.

In an embodiment, the wire retention combs 105, 110 are provided with a plurality of uniformly spaced prongs 25 configured to laterally and/or axially align the wire leads with the solder pads 80 provided on the printed circuit board. Void spaces between the prongs are dimensioned to receive the wire leads 70 (FIG. 2), which leads are properly positioned with respect to the solder pads 80 with the prongs 25. The number of prongs, void spacing and associated lateral and axial dimensions of the prongs and void spaces may match the type of electrical connector 20, number of wire leads 70 to be soldered to the printed circuit board 30, the diameter of the wire leads 70, whether both top and underside surfaces of the printed circuit board 30 are to soldered, and the required spacing of the wire leads 70 for proper positioning with the solder pads 80 provided on the printed circuit board 30.

The flexibility of the soldering fixture 100 allows for soldering of unitary and multiple segmented electrical connectors 20 to one or more surfaces of the printed circuit board 30. Different configurations of printed circuit boards may also be used with the soldering fixture 100 by changing the arrangements for maintaining the printed circuit board 30 in the particular orientation or by selection of different wire retention combs 105, 110.

In an embodiment, the upper wire retention comb 105 is coupled to the elongated member 50 using an analogous slide locking arrangement as discussed above in which one or more axial pins 55, 65 attached to the wire retention comb 105 are laterally captured by counterpart tapered apertures (not shown) provided for in the elongated member 50.

In an embodiment, the unitary base member 10, wire alignment tool 45, wire retention comb(s) 105, 110 and other hardware associated with the soldering fixture 100 are constructed from a material having a higher melting point than the solder affixed to the solder pads 80. The construction materials may utilize metals, high temperature polymeric materials, carbon fiber composite materials or ceramic materials.

In an embodiment, the wire retention comb(s) 105, 110 may be constructed of a metal which does not readily bond with the solder affixed to the solder pads 80. For example, stainless steel and titanium.

Figure 2:
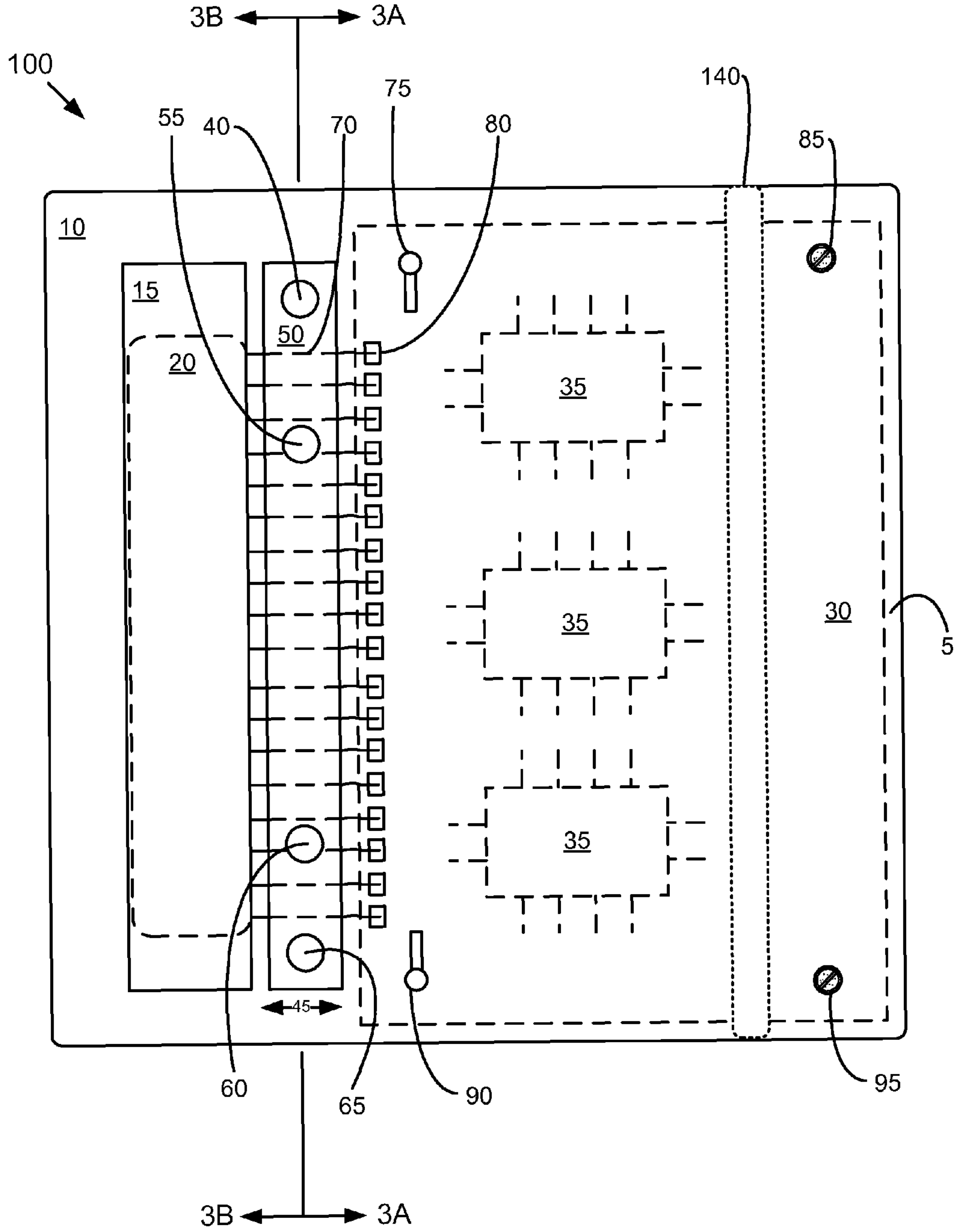
FIG. 2 is a top view of a soldering fixture in accordance with an embodiment.

FIG. 2 shows a top view of a soldering fixture 100 in accordance with an example embodiment. In this embodiment, the unitary base member 10 has an electrical connector 20 installed in the lateral channel 15. Wire leads 70 extending from the electrical connector 20 are aligned by the wire alignment tool 45 such that the wire leads are positioned in juxtaposition and/or in contact with the solder pads 80 provided on one surface of the printed circuit board 30. In this embodiment, the printed circuit board 30 is maintained in the particular orientation on the predominate face 5 of the unitary base member 10 by a pair of fasteners 85, 95 and a pair of clips 75, 90. Alternately, or in conjunction with the pair of fasteners 85, 95 and/or the pair of clips 75, 90, a band 140 is provided to maintain the printed circuit board 30 in the particular orientation on the predominate face 5 of the unitary base member 10. For simplicity and ease of understanding, the wire retention comb(s) 105, 110 have been omitted from this view. More detailed views of the wire retention comb(s) 105, 110 and relationships to other features of the soldering fixture 100 are provided in FIG. 3A, FIG. 3B as discussed below.

Figure 3A:
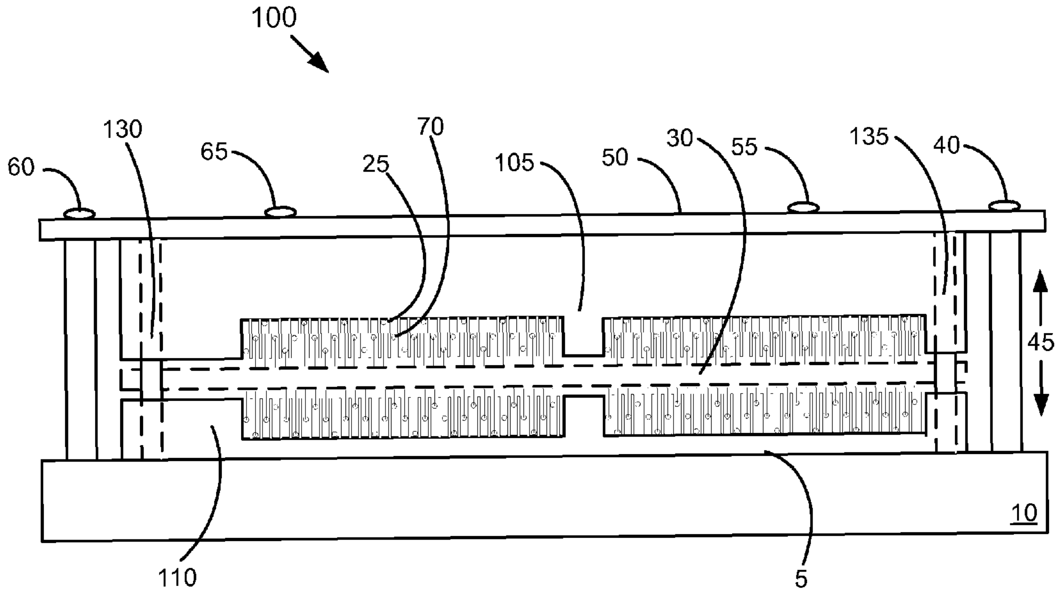
FIG. 3A is a front view of a soldering fixture in accordance with an embodiment.

FIG. 3A shows a front view of the soldering fixture 100 in accordance with an example embodiment. In this embodiment, a pair of wire retention combs 105, 110 are installed in the wire alignment tool 45 for aligning the wire leads 70 extending from the electrical connector 20 (FIG. 3B) by the prongs 25 of the wire retention combs 105, 110. In an embodiment, the wire retention combs 105, 110 are aligned perpendicular to the predominate face 5 of the unitary base member 10 with a pair of axial alignment pins 130, 135 and attached to the elongated member 50 using the previously discussed slide-lock arrangement in which the axial pins 55, 65 are laterally captured by counterpart tapered apertures (not shown) provided for in the elongated member 50. Analogously, the elongated member 50 is attached to the unitary base member by the slide-lock arrangement in which the pair of axially aligned support columns 40, 60 are captured by counterpart tapered apertures (not shown) provided for in the elongated member 50.

Figure 3B:
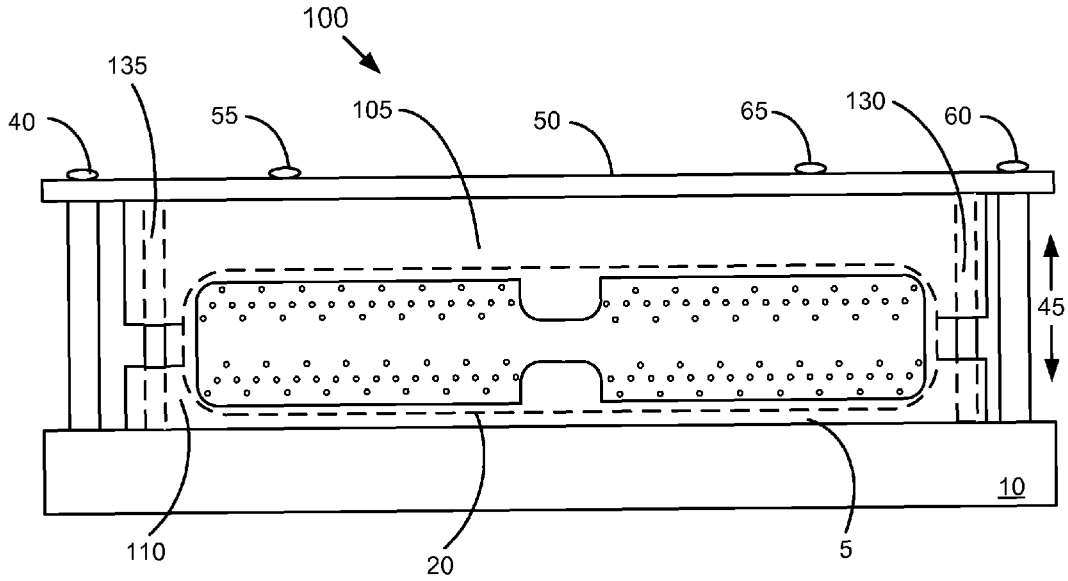
FIG. 3B is a rear view of a soldering fixture in accordance with an embodiment.

FIG. 3B shows a rear view of the soldering fixture 100 in accordance with an example embodiment. In this embodiment, the electrical connector 20 is shown aligned by the wire retention combs 105, 110 installed in the wire alignment tool 45. The electrical connector 20 is shown as a segmented socket having a plurality of pins for connection with a cable or another printed circuit board. The wire leads 70 (FIG. 3A) extend from the plurality of pins associated with the electrical connector 20 and aligned for soldering as described above.

Figure 4:
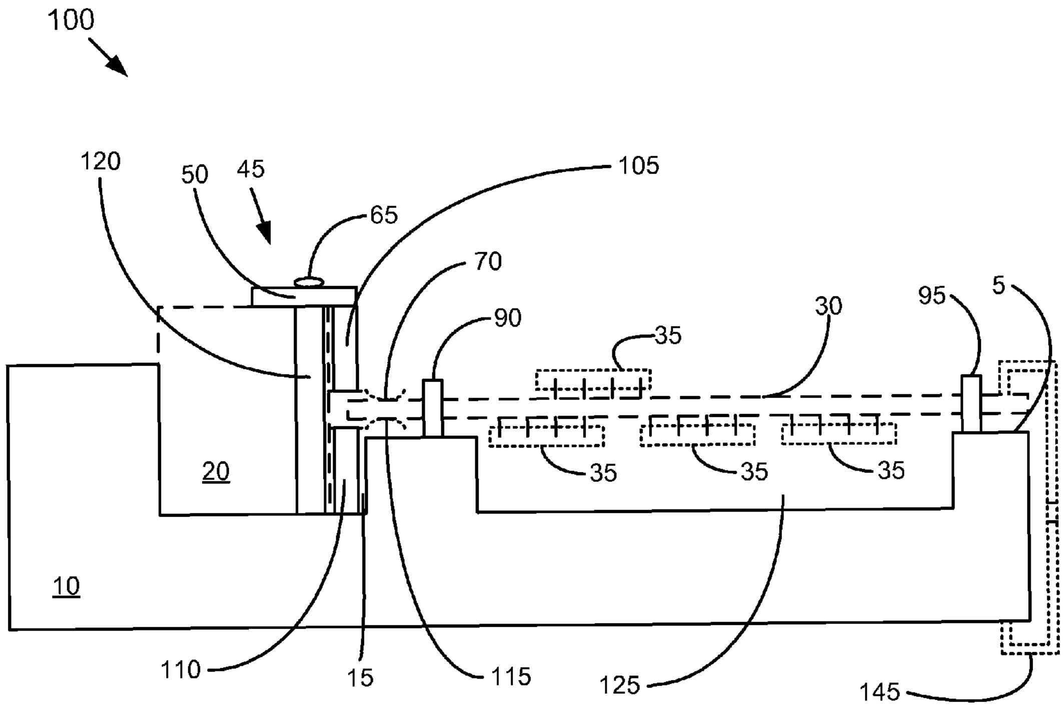
FIG. 4 is a side view of a soldering fixture in accordance with an embodiment.

FIG. 4 shows a side view of the soldering fixture 100 in accordance with an example embodiment. In this embodiment, the unitary base member 10 is provided with a cutout 125 which allows sufficient clearance of electronic components 35 mounted on an underside of the printed circuit board 30. In this embodiment, the printed circuit board 30 is maintained in the particular orientation on face 5 of the unitary base member 10 by a pair of alignment pins 90, 95 or a clamp 145 or both. The wire retention combs 105, 110 are configured to align a first set of wire leads 70 onto a top surface of the printed circuit board 30 and second set of wire leads 115 onto an underside surface of the printed circuit board 30 for soldering. The wire alignment tool 45 and electrical connector 20 are shown aligned in parallel within the lateral channel 15 of the unitary base member 10. The gap shown between the wire alignment tool 45 and the forward edge of the lateral channel 15 is optional. In an embodiment, the electrical connector 20 ad the wire alignment tool 45 fills a width of the lateral channel 15.

3.2 Soldering Fixture Functional Details

Figure 5:
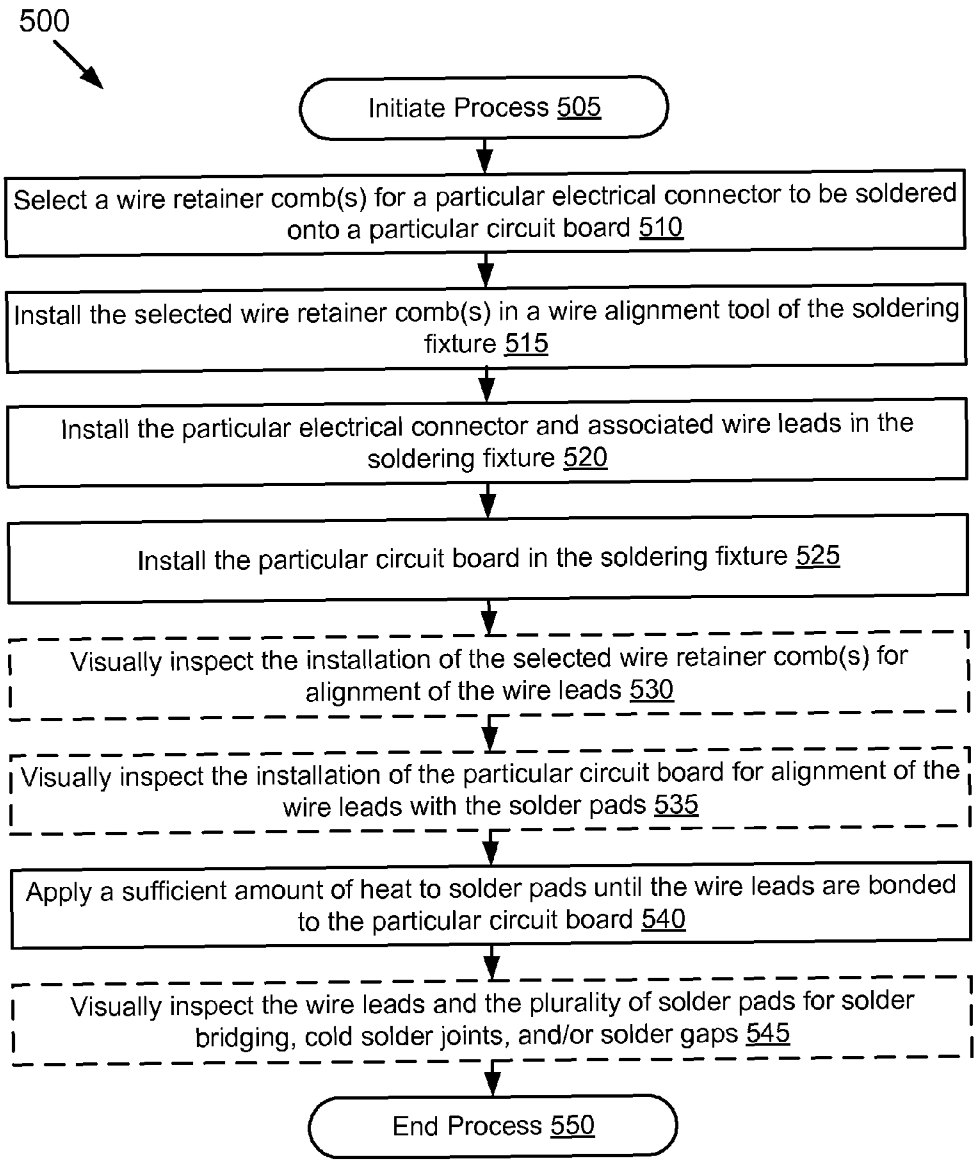
FIG. 5 illustrates a process for using a soldering fixture in an embodiment.

Referring to FIG. 5, a process flow chart 500 for using a soldering fixture in accordance with an example embodiment is shown. The process for using a soldering fixture 500 is initiated at step 505 by a user selecting a wire retainer comb for a particular electrical connector; the electrical connector having a plurality of wire leads associated therewith to be soldered onto a particular circuit board at step 510. The process for using a soldering fixture continues by the user installing the selected wire retainer comb(s) in a wire alignment tool of the soldering fixture at step 515.

The process for using a soldering fixture 500 continues by the user installing the particular electrical connector and associated wire leads in the soldering fixture at step 520, followed thereafter by the user installing the particular circuit board in the soldering fixture at step 525.

One skilled in the art will appreciate that the installation order of the wire retention comb(s), electrical connector and/or the printed circuit board may altered without loss of functionality. Optionally, the user may chose to visually inspect the installation of the selected wire retainer comb(s) for alignment of the wire leads at step 530 and visually inspecting the installation of the particular circuit board for alignment of the wire leads with the plurality of solder pads at step 535.

The process for using a soldering fixture 500 continues by the user applying a sufficient amount of heat to at least the plurality of solder pads until the wire leads are bonded to the plurality of solder pads affixed to the particular circuit board at step 540.

Optionally, after the sufficient amount of heat has been applied, the user may chose to visually inspect the wire leads and the plurality of solder pads for any of solder bridging, cold solder joints, and/or solder gaps. Process 500 ends at step 550.

4.0 Extensions and Alternatives

In the foregoing specification, various inventive embodiments have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage, sequence, order or attribute that is not expressly recited in a claim should limit the scope of such claim in any way. The specification and drawings are, accordingly, to be regarded in an example rather than a restrictive sense.

What is claimed is:

1. A process for soldering an electrical connector to a printed circuit board using a soldering fixture comprising a unitary base member configured to maintain a printed circuit board and an electrical connector in a particular orientation during soldering, the unitary base member comprising a lateral channel dimensioned to maintain a plurality of wire leads associated with the electrical connector in a spaced relationship with the printed circuit board; a wire alignment tool configured to align the plurality of wire leads in the particular orientation such that the plurality of wire leads are in at least juxtaposition with a plurality of solder pads affixed to one or more surfaces of the printed circuit board;

the process comprising:

selecting a wire retainer comb for a particular electrical connector having a plurality of wire leads associated therewith to be soldered onto a particular circuit board;

installing the selected wire retainer comb by slidably coupling the selected wire retainer comb to the wire alignment tool of the soldering fixture, wherein slidably coupling the selected wire retainer comb to the wire alignment tool includes causing one or more axial pins attached to the wire retainer comb to be laterally captured by one or more tapered apertures of the wire alignment tool;

installing the particular electrical connector and associated wire leads in the soldering fixture;

installing the particular circuit board in the soldering fixture;

applying a sufficient amount of heat to at least a plurality of solder pads until the wire leads are bonded to the plurality of solder pads affixed to the particular circuit board.

2. The process of claim 1 further comprising:

visually inspecting the installation of the selected wire retainer comb for alignment of the wire leads before applying the sufficient amount of heat;

visually inspecting the installation of the particular circuit board for alignment of the wire leads with the plurality of the solder pads before applying the sufficient amount of heat.

3. The process of claim 1 further comprising visually inspecting the wire leads and the plurality of solder pads for any of solder bridging, cold solder joints, and solder gaps after applying the sufficient amount of heat to the plurality of solder pads.

4. The process of claim 1 wherein the particular electrical connector is a line replaceable module.

5. The process of claim 1 wherein the soldering comprises a reflow solid solder deposit process.

6. The process of claim 1 wherein the selected wire retainer comb comprises a plurality of uniformly spaced prongs configured to align the plurality of wire leads with the plurality of solder pads affixed to the particular circuit board.

7. A process for soldering an electrical connector to a printed circuit board using a soldering fixture comprising a unitary base member configured to maintain a printed circuit board and an electrical connector in a particular orientation during soldering, the unitary base member comprising a wire alignment tool configured to align the plurality of wire leads in the particular orientation;

the process comprising:

selecting a wire retainer comb for a particular electrical connector having a plurality of wire leads associated therewith to be soldered onto a particular circuit board;

installing the selected wire retainer comb by slidably coupling the selected wire retainer comb to the wire alignment tool of the soldering fixture, wherein slidably coupling the selected wire retainer comb to the wire alignment tool includes causing one or more axial pins attached to the wire retainer comb to be laterally captured by one or more tapered apertures of the wire alignment tool;

installing the particular electrical connector and associated wire leads in the soldering fixture;

installing the particular circuit board in the soldering fixture;

applying a sufficient amount of heat to at least a plurality of solder pads until the wire leads are bonded to the plurality of solder pads affixed to the particular circuit board.

8. The process of claim 7 further comprising:

visually inspecting the installation of the selected wire retainer comb for alignment of the wire leads before applying the sufficient amount heat;

visually inspecting the installation of the particular circuit board for alignment of the wire leads with the plurality of the solder pads before applying the sufficient amount of heat.

9. The process of claim 7 further comprising visually inspecting the wire leads and the plurality of solder pads for any of solder bridging, cold solder joints, and solder gaps after applying the sufficient amount of heat to the plurality of solder pads.

10. The process of claim 7 wherein the particular electrical connector is a line replaceable module.

11. The process of claim 7 wherein the soldering comprises a reflow solid solder deposit process.

12. The process of claim 7 wherein the selected wire retainer comb comprises a plurality of uniformly spaced prongs configured to align the plurality of wire leads with the plurality of solder pads affixed to the particular circuit board.

* * * * *